US012256521B2

United States Patent
Amalfi et al.

(10) Patent No.: US 12,256,521 B2
(45) Date of Patent: Mar. 18, 2025

(54) APPARATUS FOR COOLING ELECTRONIC CIRCUITRY COMPONENTS AND PHOTONIC COMPONENTS

(71) Applicant: Nokia Technologies Oy, Espoo (FI)

(72) Inventors: Raffaele Luca Amalfi, New Providence, NJ (US); Stefano Grillanda, Springfield, NJ (US); Ryan Enright, Floral Park, NY (US)

(73) Assignee: Nokia Technologies Oy, Espoo (FI)

( * ) Notice: Subject to any disclaimer, the term of this patent is extended or adjusted under 35 U.S.C. 154(b) by 214 days.

(21) Appl. No.: 17/863,506

(22) Filed: Jul. 13, 2022

(65) Prior Publication Data
US 2023/0024390 A1    Jan. 26, 2023

(30) Foreign Application Priority Data
Jul. 20, 2021  (EP) .................................... 21186594

(51) Int. Cl.
*H05K 7/20*     (2006.01)
*H01S 5/024*    (2006.01)

(52) U.S. Cl.
CPC ...... *H05K 7/20336* (2013.01); *H01S 5/02415* (2013.01); *H01S 5/02469* (2013.01)

(58) Field of Classification Search
CPC ................................................ H05K 7/20336
See application file for complete search history.

(56) References Cited

U.S. PATENT DOCUMENTS

| | | | | |
|---|---|---|---|---|
| 6,936,491 | B2* | 8/2005 | Partridge | B81C 1/00301 |
| | | | | 438/48 |
| 8,878,071 | B2* | 11/2014 | Brunschwiler | H01L 21/762 |
| | | | | 174/254 |
| 10,180,709 | B1* | 1/2019 | Hamburgen | H01L 23/345 |
| 10,785,893 | B1* | 9/2020 | Kuo | G06F 1/206 |
| 2003/0142712 | A1* | 7/2003 | Ikeda | H01S 5/02415 |
| | | | | 372/36 |
| 2006/0285475 | A1* | 12/2006 | Ishibashi | G11B 33/1406 |
| 2009/0101308 | A1* | 4/2009 | Hardesty | F28D 15/0266 |
| | | | | 165/80.4 |
| 2010/0079955 | A1* | 4/2010 | Li | H01L 23/3737 |
| | | | | 361/703 |
| 2011/0067843 | A1* | 3/2011 | Vasiliev, Jr. | H01L 23/427 |
| | | | | 165/104.26 |
| 2012/0049233 | A1* | 3/2012 | Yuan | H01L 25/167 |
| | | | | 257/E33.001 |
| 2015/0083376 | A1* | 3/2015 | Hamburgen | H05K 7/20 |
| | | | | 165/135 |

(Continued)

*Primary Examiner* — Sagar Shrestha
(74) *Attorney, Agent, or Firm* — McCarter & English, LLP (57) ABSTRACT

An apparatus for cooling electronic circuitry components and photonic components. In examples of the disclosure at least one photonic component is positioned overlaying at least one electronic circuitry component. In examples of the disclosure there is also provided a spacer for spacing the at least one electronic circuitry component and the at least one photonic component, wherein the spacer for spacing are thermally insulating. In examples of the disclosure there is also provided a first heat transfer configured to remove heat from the at least one electronic circuitry component, and a second heat transfer configured to remove heat from the at least one photonic component.

16 Claims, 8 Drawing Sheets

(56) References Cited

U.S. PATENT DOCUMENTS

| | | | |
|---|---|---|---|
| 2015/0104922 A1* | 4/2015 | Brunschwiler | H01L 21/76898 438/667 |
| 2016/0037681 A1* | 2/2016 | Lee | H04B 1/036 455/556.1 |
| 2017/0135247 A1* | 5/2017 | Ogata | F28D 15/025 |
| 2018/0279503 A1* | 9/2018 | Chow | H05K 7/20372 |
| 2018/0299206 A1* | 10/2018 | Kim | F28D 15/025 |
| 2019/0035713 A1* | 1/2019 | Prajapati | H05K 7/20336 |
| 2019/0178434 A1* | 6/2019 | Sakatani | C04B 41/009 |
| 2020/0152549 A1* | 5/2020 | Joshi | H05K 7/20927 |
| 2020/0269543 A1* | 8/2020 | Yang | B32B 7/027 |
| 2020/0281096 A1* | 9/2020 | Shioga | F28D 15/046 |
| 2021/0022266 A1* | 1/2021 | Shaikh | H01L 23/36 |
| 2021/0072473 A1* | 3/2021 | Wall, Jr. | H05K 1/0274 |
| 2021/0105909 A1* | 4/2021 | Ide | H04N 23/667 |
| 2022/0007545 A1* | 1/2022 | Embleton | H02G 15/00 |
| 2022/0338387 A1* | 10/2022 | Enright | H05K 7/20727 |

\* cited by examiner

| $t_{interposer}$ [μm] | $Q_{upward}$ [W] | $Q_{downward}$ [W] | Cross-talk [%] |
|---|---|---|---|
| 10 | 1.69 | 3.31 | 33.70 |
| 45 | 0.64 | 4.36 | 12.85 |
| 80 | 0.40 | 4.60 | 7.94 |
| 115 | 0.29 | 4.71 | 5.74 |
| 150 | 0.22 | 4.78 | 4.50 |
| 185 | 0.18 | 4.82 | 3.70 |
| 220 | 0.16 | 4.84 | 3.14 |
| 255 | 0.14 | 4.86 | 2.73 |
| 290 | 0.12 | 4.88 | 2.41 |

| $t_{interposer}$ [μm] | $Q_{upward}$ [W] | $Q_{downward}$ [W] | Cross-talk [%] |
|---|---|---|---|
| 10 | 1.23 | 3.77 | 24.61 |
| 45 | 0.39 | 4.61 | 7.86 |
| 80 | 0.23 | 4.77 | 4.68 |
| 115 | 0.17 | 4.83 | 3.33 |
| 150 | 0.13 | 4.87 | 2.59 |
| 185 | 0.11 | 4.89 | 2.11 |
| 220 | 0.09 | 4.91 | 1.79 |
| 255 | 0.08 | 4.92 | 1.55 |
| 290 | 0.07 | 4.93 | 1.36 |

| $t_{interposer}$ [μm] | $Q_{upward}$ [W] | $Q_{downward}$ [W] | Cross-talk [%] |
|---|---|---|---|
| 10 | 0.89 | 4.11 | 17.80 |
| 45 | 0.24 | 4.76 | 4.81 |
| 80 | 0.14 | 4.86 | 2.78 |
| 115 | 0.10 | 4.90 | 1.96 |
| 150 | 0.08 | 4.92 | 1.51 |
| 185 | 0.06 | 4.94 | 1.23 |
| 220 | 0.05 | 4.95 | 1.03 |
| 255 | 0.04 | 4.96 | 0.89 |
| 290 | 0.04 | 4.96 | 0.79 |

APPARATUS FOR COOLING ELECTRONIC CIRCUITRY COMPONENTS AND PHOTONIC COMPONENTS

TECHNOLOGICAL FIELD

Examples of the disclosure relate to apparatus for cooling electronic circuitry components and photonic components. Some relate to apparatus for cooling electronic circuitry components and photonic components that could be used within consumer electronic devices.

BACKGROUND

Electronic circuitry components and photonic components can generate unwanted heat during use. In many cases the photonic components will generate less heat than electronic components but the photonic components might be more temperature sensitive and stable operating temperatures may improve the efficiency of operation of such devices. This needs to be taken into account when packaging such components for use in devices such as consumer electronic devices.

BRIEF SUMMARY

According to various, but not necessarily all, examples of the disclosure, there is provided an apparatus comprising:
   at least one electronic circuitry component;
   at least one photonic component wherein the at least one photonic component is positioned overlaying the at least one electronic circuitry component;
   means for spacing the at least one electronic circuitry component and the at least one photonic component wherein the means for spacing are thermally insulating;
   first heat transfer means configured to remove heat from the at least one electronic circuitry component; and
   second heat transfer means configured to remove heat from the at least one photonic component.

The first heat transfer means may be separate to the second heat transfer means.

At least one of the first heat transfer means and the second heat transfer means may comprise a single-phase or a two-phase cooling system.

The two-phase cooling system may comprise an oscillating heat pipe.

The apparatus may comprise temperature control means for controlling the temperature of the at least one photonic component.

The temperature control means may comprise a thermoelectric cooling component.

The apparatus may comprise means for providing signals between the at least one electronic circuitry component and the at least one photonic component.

The at least one electronic circuitry component may be configured to control the at least one photonic component.

The at least one electronic circuitry component may be configured to drive the at least one photonic component.

The at least one electronic circuitry component may be configured to receive signals from the at least one photonic component.

The means for spacing may comprise one or more supports between the at least one electronic circuitry component and the at least one photonic component wherein the supports provide an air gap between the at least one electronic circuitry component and the at least one photonic component.

The means for spacing may comprise aerogel.

The at least one electronic circuitry component may comprise a chip.

The at least one photonic component may comprise a chip.

The at least one photonic component may be positioned overlaying the at least one electronic circuitry component so that a surface of the at least one photonic component faces a surface of the at least one electronic circuitry component.

According to various, but not necessarily all, examples of the disclosure, there is provided an apparatus comprising:
   at least one electronic circuitry component;
   at least one photonic component wherein the at least one photonic component is positioned overlaying the at least one electronic circuitry component;
   at least one spacer configured to space the at least one electronic circuitry component and the at least one photonic component wherein the at least one spacer is thermally insulating;
   first heat transfer system configured to remove heat from the at least one electronic circuitry component; and
   second heat transfer system configured to remove heat from the at least one photonic component.

According to various, but not necessarily all, examples of the disclosure, there is provided an electronic device comprising an apparatus as described above.

BRIEF DESCRIPTION

Some examples will now be described with reference to the accompanying drawings in which.

DETAILED DESCRIPTION

Examples of the disclosure relate to apparatus for cooling electronic circuitry components and photonic components. In examples of the disclosure the photonic component is provided overlaying the electronic circuitry components so that the photonic component faces the electronic circuitry component. A thermally insulating spacer is provided between the electronic circuitry components and photonic components so as to prevent heat transfer between the electronic circuitry components and photonic components. The use of the thermally insulating spacer can allow the photonic component to be positioned close to the electronics component. A first heat transfer means is provided for cooling the electronic circuitry component and a second heat transfer means is provided for cooling the photonic components. The first heat transfer means can be separate to the second heat transfer means.

Figure 1:
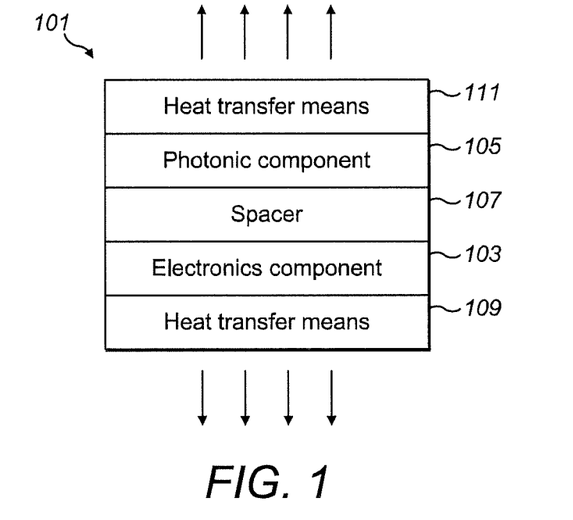
FIG. 1 shows an example apparatus.

FIG. 1 schematically shows an apparatus 101 according to examples of the disclosure.

The apparatus 101 can comprise optoelectronic components that can be provided inside of an electronic device such as a smartphone, tablet, computer or other suitable consumer electronic device. In the example of FIG. 1 the apparatus 101 comprises at least one electronic circuitry component 103, at least one photonic component 105, at least one spacer 107, a first heat transfer means 109 and a second heat transfer means 111. It is to be appreciated that the apparatus 101 could comprise other components in other examples of the disclosure.

The electronic circuitry component 103 and photonic component 105 can comprise any suitable combination of components. For instance, in some examples the electronic circuitry component 103 could comprise a driver and the photonic component could comprise a laser, a modulator or a semiconductor amplifier or combination of those components and/or arrays of those components. In some examples the electronic circuitry component 103 could comprise an amplifier, such as a transimpedance amplifier or an amplifier array and the photonic component 105 could comprise a photodetector or a photodetector array.

The electronic circuitry component 103 comprises electronic circuitry mounted on a surface of a substrate. The electronic circuitry component 103 can comprise a chip or any other suitable component. The chip could comprise integrated circuits embedded in a single unit or any other suitable arrangement. In some examples the electronic circuitry component 103 can comprise one or more controllers or drivers that can be configured to control or drive the photonics components. In some examples the electronic circuitry component 103 could also be configured to provide control signals to and/or to receive control signals from other components within an electronic device. The electronic circuitry can be configured to receive signals from the photonics components 105. These signals could be used to enable the electronic circuitry component 103 to control or drive the photonics components 105.

The photonic component 105 comprises one or more optical circuits mounted on a surface of a substrate. The photonic component 105 can comprise a chip or any other suitable component. The chip could comprise integrated circuits embedded in a single unit or any other suitable arrangement. The optical circuits can be configured to provide light sources or other optical signals. The photonic components 105 can be configured for use in LiDAR applications, mediated reality, bio-sensing, health monitoring, optical communications or for any other suitable purpose.

The photonic component 105 is positioned overlaying the electronic circuitry component 103 so that it faces the electronic circuitry component 103. The photonic component 105 is positioned so that the surface of the substrate upon which the optical circuits are mounted is facing the surface of the substrate upon which the electronic circuitry is mounted. This ensures that a surface of the electronic circuitry component 103 faces a surface of the photonic component 105.

A spacer 107 is provided between the electronic circuitry component 103 and the photonic component 105. The spacer 107 can comprise any means for spacing the electronic circuitry component 103 and the photonic component 105.

The spacer 107 is thermally insulating. The spacer 107 can enable the electronic circuitry component 103 to be thermally isolated from the photonics component 105. The spacer 107 can be thermally isolating to allow the electronic circuitry component 103 to be positioned close to the photonics component 105 without causing unwanted heating of each other. For example, the thermal insulation can prevent heat from processors on the electronic circuitry component 103 from heating the photonics component 105.

In some examples the spacer 107 can comprise one or more supports between the electronic circuitry component 103 and the photonic component 105. The supports can be configured to provide an air gap between the electronic circuitry component 103 and the photonic component 105. In some examples the spacer 107 can comprise an aerogel or any other suitable material.

The apparatus 101 also comprises a first heat transfer means 109 configured to remove heat from the electronic circuitry component 103 and second heat transfer means 111 configured to remove heat from the photonic component 105 and control its temperature. The heat transfer means can comprise heat transfer systems such as two-phase cooling systems or any other suitable cooling system. For temperature stabilization a thermo-electric cooler can be used or any other suitable device.

The first heat transfer means 109 can be separate to the second heat transfer means 111. The first heat transfer means 109 can be separate to the second heat transfer means 111 so that the amount of heat being transferred in the first heat transfer means 109 does not affect the efficiency of the second heat transfer means 111 and similarly the amount of heat being transferred in the second heat transfer means 111 does not affect the efficiency of the first heat transfer means 109. The first heat transfer means 109 can be thermally isolated from the second heat transfer means 111. In some examples the first heat transfer means 109 can be configured to reject heat to a different heat sink to the second heat transfer means 111. In some examples the first heat transfer means 109 can transfer the heat in a different direction to the second heat transfer means 111 as indicated by the arrows in FIG. 1.

The use of the thermally insulating spacer 107 and the respective heat transfer means 109, 111 can reduce heating of the photonic component 105 by the electronic circuitry component 103. This can enable the photonic component 105 to be positioned close to the electronic circuitry component 103 while maintaining effective functionality of the photonic component 105. This can provide for a small apparatus 101 which is beneficial for packaging in consumer electronic devices.

It is also to be appreciated that the thermally insulating spacer 107 and the respective heat transfer means 109, 111 can reduce heating of the electronic circuitry component 103 by the photonic component 105. For example, if the photonic components 105 comprises an array of several semiconductor lasers or optical amplifiers then the thermally insulating spacer 107 and the respective heat transfer means 109, 111 reduce the heat directed towards the electronics components 103 from the photonic component 105.

Also, by enabling the photonic component 105 to be positioned close to the electronic circuitry component 103 this can reduce the length of any electrical connections used between the photonic component 105 and the electronic circuitry component 103. This can help to reduce effects such as loss, distortion and cross talk in signals that are transmitted via the electrical connections. This can allow for faster and more accurate signaling between the electronic circuitry component 103 and the photonic component 105.

In the example shown in FIG. 1 only one electronic circuitry component 103 and one photonics component 105 are shown. It is to be appreciated that in other examples the apparatus 101 could comprise any number of electronic circuitry components 103 and photonics components 105.

Figure 2:
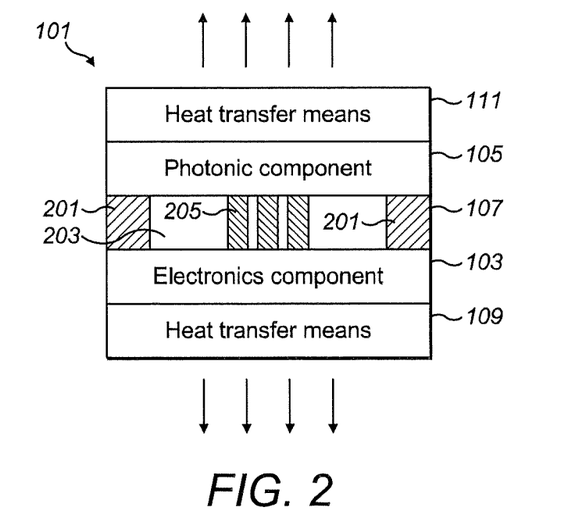
FIG. 2 shows an example apparatus.

FIG. 2 schematically shows another example apparatus 101. In this example the apparatus comprises an electronic circuitry component 103, a photonic component 105, a spacer 107, a first heat transfer means 109 and a second heat transfer means 111 which can be as shown in FIG. 1 and described above. Corresponding reference numerals are used for corresponding features.

In the example of FIG. 2 the spacer 107 comprises a plurality of supports 201 and an air gap 203.

In the example of FIG. 2 two supports 201 are shown at the edges of the apparatus 101. It is to be appreciated that in other examples a different number of supports 201 could be provided and the supports 201 could be provided in different positions.

The plurality of supports 201 is positioned between the electronic circuitry component 103 and the photonic component 105. In some examples the supports 201 can be positioned between a substrate of the electronic circuitry component 103 and a substrate of the photonic component 105. The plurality of supports 201 provides the air gap 203 between the electronic circuitry component 103 and the photonic component 105.

The plurality of supports 201 can be configured to provide structural stability to the apparatus 101. In some examples the plurality of supports can be load bearing so that the supports bear, at least, some of the weight of the photonic component 105. The plurality of supports 201 can be positioned in any suitable location within the apparatus 201. The number of supports 201 that are provided within the apparatus 101 can be determined by factors such as the size of the supports 201, the size of the electronic circuitry component 103 and the photonic component 105 and any other suitable factors.

The supports 201 can comprise any suitable material. In some examples the supports 201 can comprise a thermally insulating material. The supports 201 could comprise a polymer or any other suitable material.

The example apparatus 101 of FIG. 2 also comprises one or more pillars 205 that extend between the electronic circuitry component 103 and the photonic component 105. The pillars 205 can comprise means for providing signals between the electronic circuitry component 103 and the photonic component 105. For example, the pillars 205 can comprise an electrical connection, or other suitable type of connection between the electronic circuitry component 103 and the photonic component 105.

The pillars 205 can comprise an electrically conductive material such as a metal or any other material that allows for the transfer of the signals between the electronic circuitry component 103 and the photonic component 105.

In some examples the pillars 205 could be load bearing so that the pillars 205 bear at least some of the weight of the photonic component 105 or any other part of the apparatus 101. In such examples the material 205 used for the pillars 205 could be selected to enable the pillars 205 to bear the load as needed.

In the example of FIG. 2 three pillars 205 are shown in a central position within the apparatus 101. It is to be appreciated that in other examples the apparatus 101 could comprise other numbers of pillars 205 that could be provided in different positions. The number of pillars 205 that are used can be determined by the number of connections that are needed and the type of connections that are needed. The different types of connections could be the different configurations of signal and ground connections, such as ground-signal, ground-signal-ground, ground-signal-signal-ground.

In the examples shown the pillars 205 have approximately the same length as the supports 201 such that the length of the pillars 205 is determined by the size of the air gap 203 between the electronic circuitry component 103 and the photonic component 105. The size of the air gap 203 can be designed based on factors such as the functionalities of the electronic circuitry component 103 and/or the photonic component 105 and the heat generated by the electronic circuitry component 103 and/or the photonic component 105 during use and/or any other suitable factors.

In other examples the pillars could have different lengths. For example, the photonic component 105 and/or the electronic circuitry component 103 could comprise one or more recesses or depression on the surface and/or one or more projections on the surface. In such examples shorter or longer pillars could be used in the locations of the recesses and projections to take the recesses and projections into account.

In some examples the apparatus 101 can be designed so that the pillars 205 are as short as possible. This can minimise cross talk between the electrical connections within the pillars 205 or electrical parasitic effects which would cause effects such as losses and distortion of the signal. This can be particularly beneficial where the apparatus 101 is for use in high-capacity applications. By contrast, if the apparatus 101 is intended for use in low-capacity applications then the effects of cross talk or the electrical parasitic effects would not be as critical. When the apparatus 101 is intended for use in these lower capacity applications then a larger air gap 203 could be provided to provide for better thermal insulation between the electronic circuitry component 103 and the photonic component 105. This would result in longer pillars 205 and supports 201 compared to apparatus 101 that are used for high-capacity applications.

In examples where radio frequency signals are to be exchanged between the electronic circuitry component 103 and the photonic component 105 the positioning of the photonic component 105 overlaying the electronic circuitry component 103 can be beneficial as it can minimise, or substantially minimise, the distance between the endpoints of the electrical connections. The wavelength of the signals is related to the frequency by:

$$\lambda = c/f$$

where $\lambda$ is the signal wavelength, c ($\sim 3 \times 10^8$ m/s) is the speed of light in vacuum and f is the frequency. For a signal travelling through the air the wavelength varies from ~30-~0.3 cm as f varies from 1-100 GHz. The length of the electrical connections and pillars 205 should be a fraction of the wavelength so that:

$$t < \lambda$$

where t is the length of the connection.

As an example, the apparatus 101 could be designed so that t has a length of $\lambda/10$. In such cases, for the highest RF frequency of 100 GHz, the connection length, must be below 300 μm. This could be achieved by positioning the photonic component 105 overlaying the electronic circuitry component 103 as shown in the examples.

In some examples having the photonic component 105 overlaying the electronic circuitry component 103 also provides the benefits that a ground line can be provided directly between the photonic component 105 and the electronic circuitry component 103.

Figure 3:
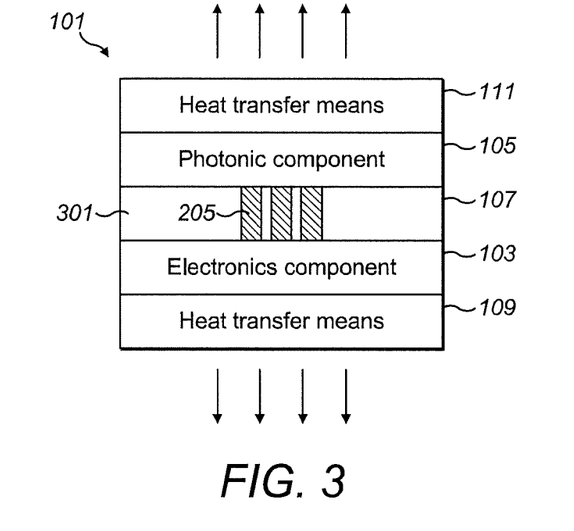
FIG. 3 shows an example apparatus.

FIG. 3 schematically shows another example apparatus 101. In this example the apparatus also comprises an electronic circuitry component 103, a photonic component 105, a spacer 107, a first heat transfer means 109 and a second heat transfer means 111, and a plurality of pillars 205 which can be as shown in FIG. 1 and FIG. 2 and described above. Corresponding reference numerals are used for corresponding features.

In the example of FIG. 3 the spacer 107 comprises a thermally insulating material such as aerogel 301. The aerogel 301 can comprise a dielectric aerogel. The aerogel 301 can comprise inorganic, silica-based aerogel and an organic polymer-based aerogel. Both of these types of aerogel 301 demonstrate thermal conductivities around 0.025 W/m/K which is close to the thermal conductivity of air. A suitable aerogel could be an aerogel with a conductivity of a range of 0.021-0.047 W/m/K at the operating temperatures of the apparatus 101.

The use of the aerogel 301 can remove the need for the supports 201 as shown in FIG. 2 due to the mechanical properties of the aerogel 301. In such examples the aerogel 301 can provide structural support for the apparatus 101. This can improve thermal insulation between the electronic circuitry component 103 and the photonic component 105 because it reduces parasitic heat flow through the supports 201. This can also reduce the complexity of the apparatus 101 and reduce the number of components within the apparatus 101.

The aerogel 301 can also provide a planar surface that can be used for the assembly of the apparatus 101.

Figure 4:
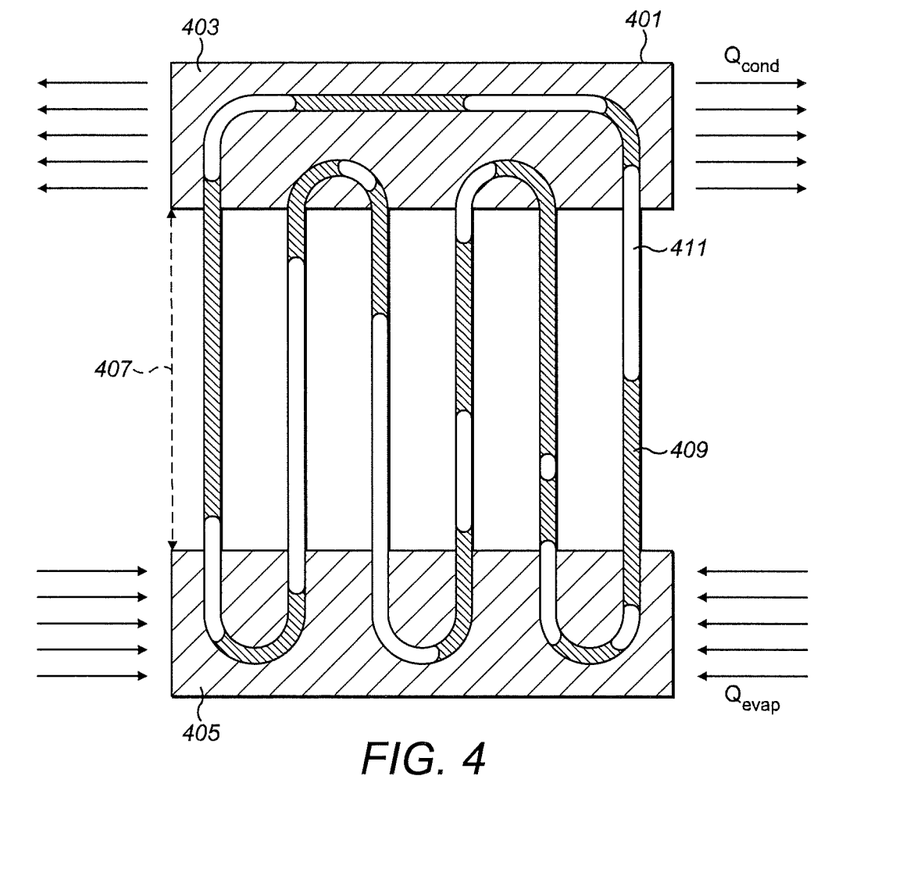
FIG. 4 shows an example oscillating heat pipe.

The heat transfer means 109, 111 that are used in the examples of the disclosure can be any suitable type of heat transfer means. In some examples the heat transfer means 109, 111 can comprise two phase cooling systems such as vapor chambers, heat pipes or oscillating heat pipes. FIG. 4 schematically shows an oscillating heat pipe 401 that could be used in some examples of the disclosure. In such examples a first oscillating heat pipe 401 could provide the first heat transfer means 109 and be configured to remove heat from the electronic circuitry component 103 and a second oscillating heat pipe 401 could provide the second heat transfer means 111 and be configured to remove heat from the photonic component 105. The oscillating heat pipes 401 could be configured to remove heat in different directions. As shown in FIGS. 1 to 3 the first heat transfer means 109 removes heat in a downwards direction and the second heat transfer means 111 removes heat in an upwards direction.

FIG. 4 shows an example oscillating heat pipe 401 that could be used as a heat transfer means 109, 111 in some examples of the disclosure. The oscillating heat pipe 401 comprises a condenser region 403, an evaporator region 405 and an adiabatic section 407.

The evaporator region 405 comprises any means for transferring heat from a heat source into the working fluid within the oscillating heat pipe 401. The evaporator region 405 is thermally coupled to a heat source. The heat source could be the electronic circuitry component 103 or the photonic component 105. The oscillating heat pipe 401 could be machined into the outer surfaces of the electronic circuitry component 103 and the photonic component 105.

The condenser region 403 comprises any means for transferring heat out of the working fluid within the oscillating heat pipe 401. The condenser region 403 is thermally coupled to a heat sink or any other suitable type of means for transferring heat out of the working fluid.

The oscillating heat pipe 401 is configured in a meandering or serpentine configuration comprising a plurality of bends. A first plurality of bends is located in the evaporator region 405 and a second plurality of bends is located in the condenser region 403. In the example shown in FIG. 4 three U-shaped bends are shown in the evaporator region 405 and two U-shaped bends are shown in the condenser region 403. Other configurations and numbers of bends could be used in other examples of the disclosure. The meandering or serpentine configuration is configured so that the working fluid within the oscillating heat pipe 401 is alternately heated in the evaporator region 405 and cooled in the condenser region 403 of the oscillating heat pipe 401.

In the example shown in FIG. 4 the oscillating heat pipe 401 forms a closed loop. Other types of oscillating heat pipe 401 could be used in other examples of the disclosure.

In the example shown in FIG. 4 an adiabatic section 407 is provided between the evaporator region 405 and the condenser region 403. The adiabatic section 407 extends between the bends in the condenser region 403 and the bends in the evaporator region 405. The adiabatic section 407 ensures that heat that is transferred into the working fluid in the evaporator region 405 is retained within the oscillating heat pipe 401 until the working fluid reaches the condenser region 403. In some examples the oscillating heat pipe 401 does not comprise an adiabatic section 407. Whether or not the oscillating heat pipe 401 comprises an adiabatic section 407 can depend on the application and system geometry of the oscillating heat pipe 401 and any other suitable factors.

When the oscillating heat pipe 401 is in use, heat is applied to the working fluid in the bends within the evaporator region 405. This heat causes, at least some of, the working fluid to evaporate. This evaporation results in an increase of vapour pressure inside the oscillating heat pipe 401 which causes the growth of bubbles within the evaporator region 405. The growth of the bubbles and the increase in vapour pressure forces liquid slugs 409 of the working fluid towards the condenser region 403. The working fluid that is pushed to the condenser region 403 is then cooled by the condenser. This cooling reduces the vapour pressure within the working fluid and causes condensation of the bubbles and provides a restoring force that pushes the working fluid back towards the evaporator region 405. This process of alternate bubble growth and condensation causes oscillation of the working fluid within the oscillating heat pipe 401 and allows for the transfer of heat between the evaporator region 405 and the condenser region 403.

Figure 5A:
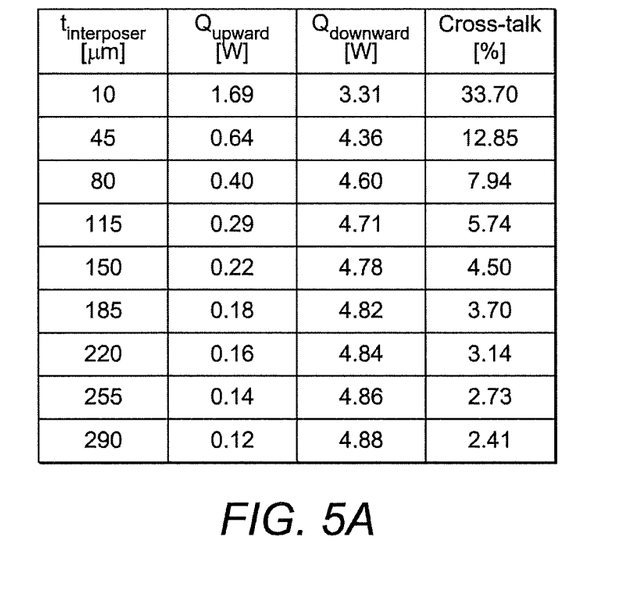
FIGS. 5A to 5C show results obtained using an example apparatus.
Figure 5B:
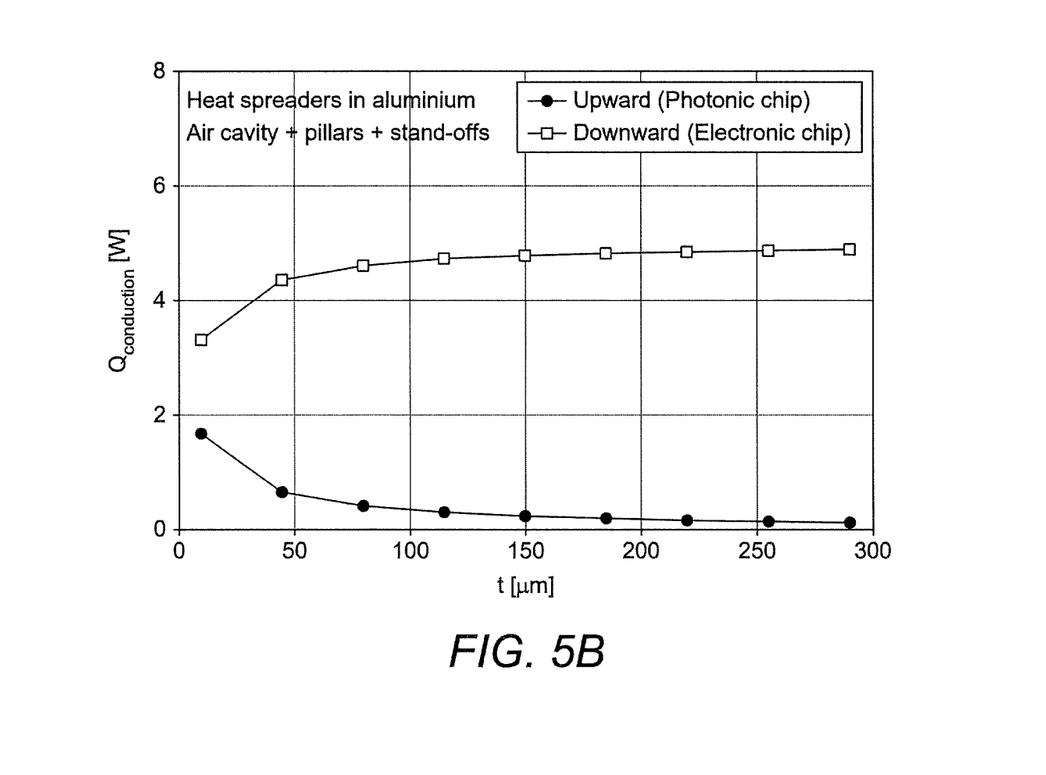
Figure 5C:
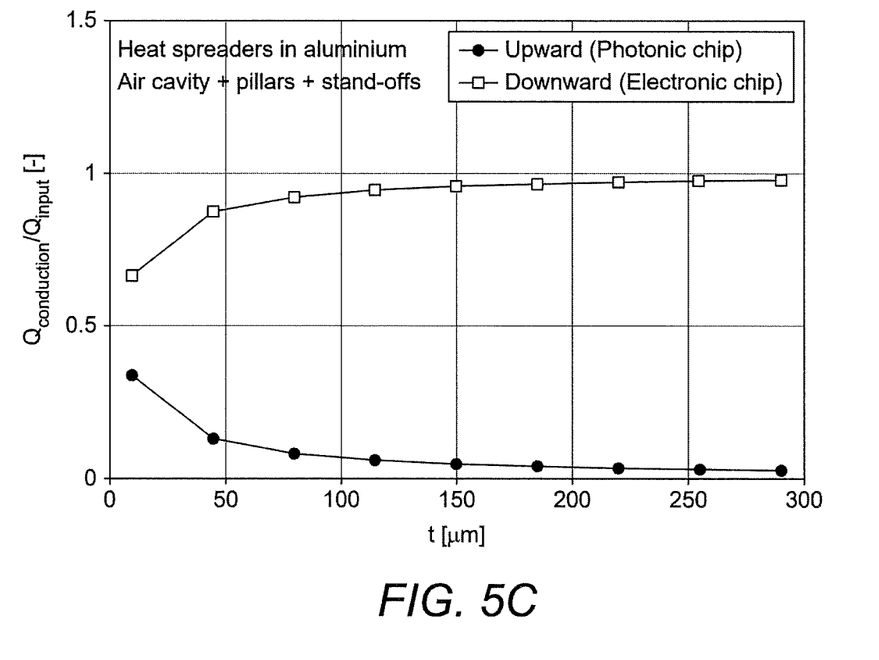

FIGS. 5A to 5C shows results obtained using an example apparatus 101. In this example the heat transfer means 109, 111 comprises aluminum heat spreaders with a first heat spreader configured to provide downwards heat rejection for the electronic circuitry component 103 and a second heat spreader configured to provide upwards heat rejection for the photonics component 105. The spacer 107 in the apparatus 101 that was used to obtain the data for FIGS. 5A to 5C comprises an air gap 203 and a plurality of supports 201 as shown in FIG. 2

Figure 6A:
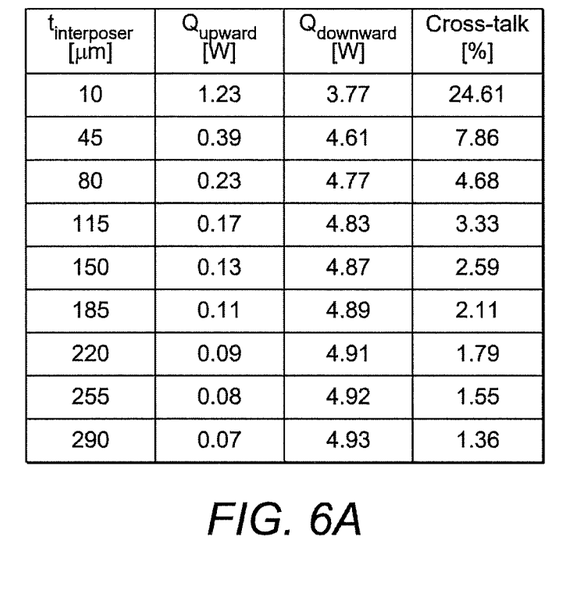
FIGS. 6A to 6C show results obtained using an example apparatus.
Figure 6B:
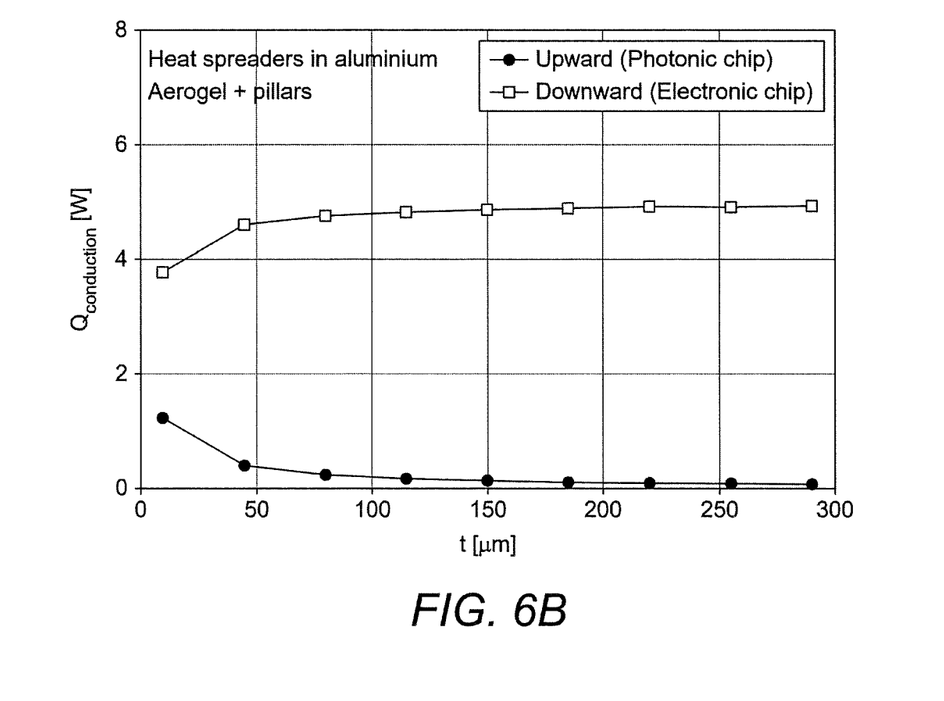
Figure 6C:
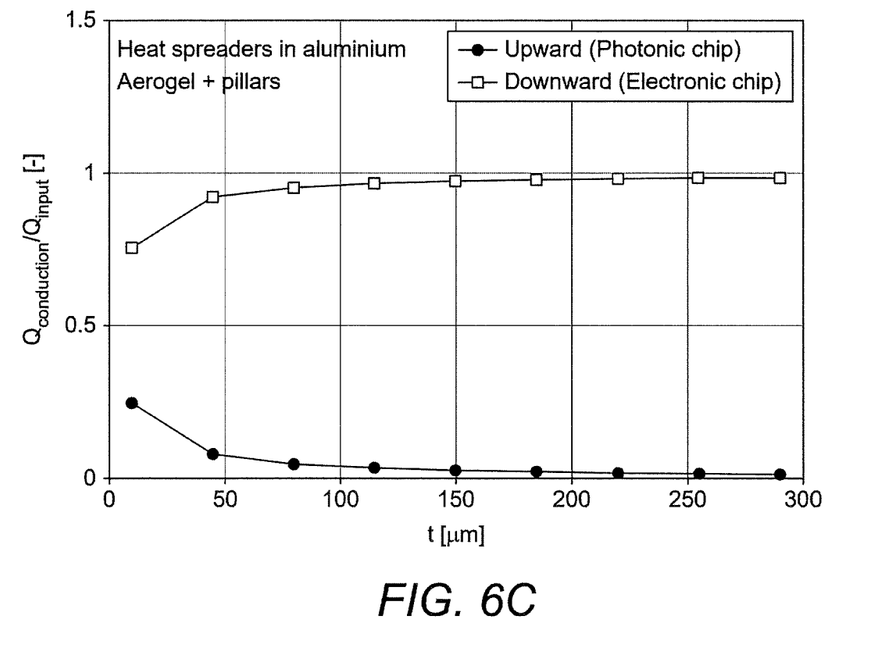

FIGS. 6A to 6C shows results obtained using another example apparatus 101. In this example the heat transfer means 109, 111 comprises aluminum heat spreaders with a first heat spreader configured to provide downwards heat rejection for the electronic circuitry component 103 and a second heat spreader configured to provide upwards heat rejection for the photonics component 105. The spacer 107 in the apparatus 101 that was used to obtain the data for FIGS. 6A to 6C comprises an aerogel 301 as shown in FIG. 3.

Figure 7A:
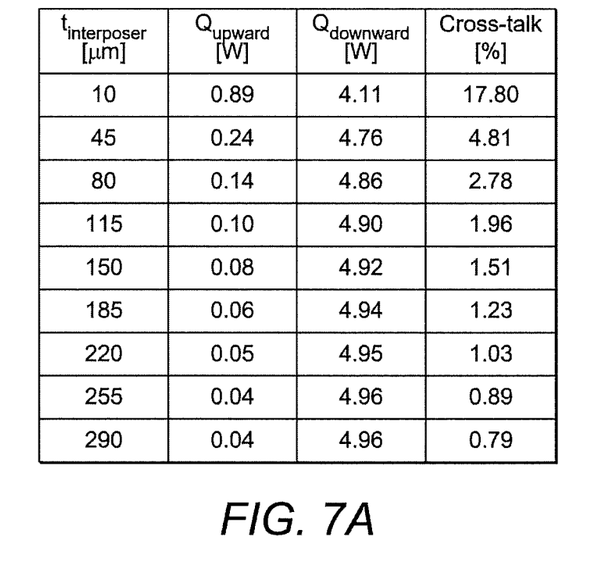
FIGS. 7A to 7C show results obtained using an example apparatus.
Figure 7B:
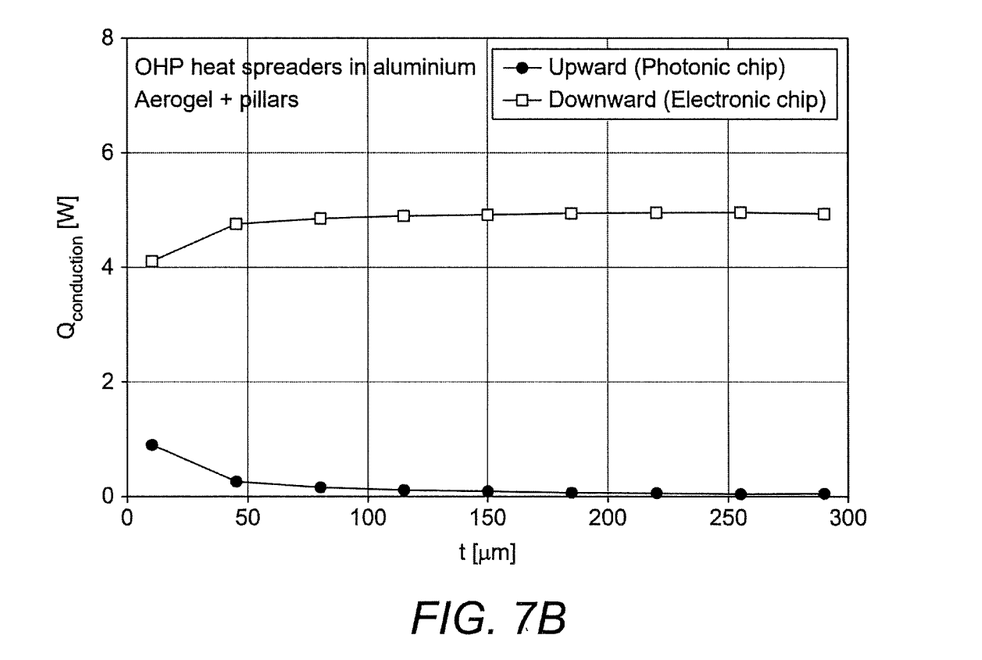
Figure 7C:
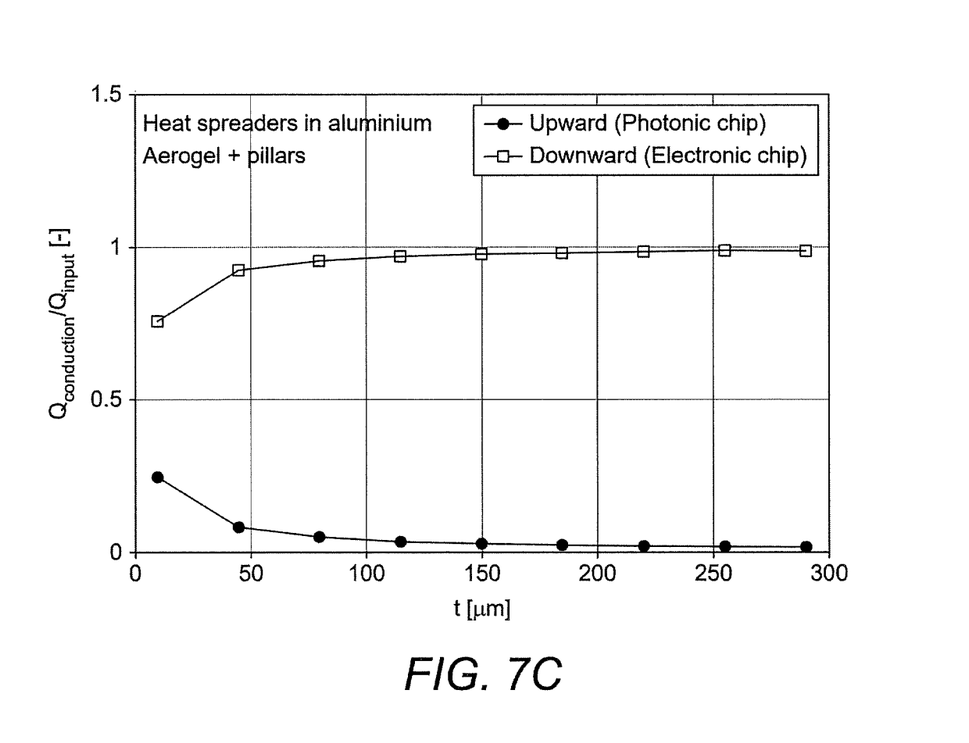

FIGS. 7A to 7C show results obtained using an example apparatus 101. In this example the heat transfer means 109, 111 comprises oscillating heat pipes 401, with a first oscillating heat pipe 401 configured to provide downwards heat rejection for the electronic circuitry component 103 and a second oscillating heat pipe 401 configured to provide upwards heat rejection for the photonics component 105. The spacer 107 in the apparatus 101 that was used to obtain the data for FIGS. 7A to 7C comprises aerogel 301. A plurality of pillars 201 was provided between the electronic circuitry component 103 and the photonic component 105.

In the simulations used to obtain the results in FIGS. 5A to 7C the thermal conductivity of the aluminium was considered to have a value of 170 W/m/K and the aerogel 301 was considered to have a thermal conductivity value of 0.025 W/m/K. The thermal conductivity for the oscillating heat pipes 401 was assumed to be 800 W/m/K. In these simulations components such as the supports 201 and pillars 205 were not included for simplicity so that the only active heat source was the electronic circuitry component 103. This was assumed to be dissipating 5 W. The hydraulic diameter for the oscillating heat pipes 401 is assumed to be 2 mm, with a wall thickness of 0.5 mm. The oscillating heat pipes 401 were assumed to operate with low pressure, eco-friendly working fluid such as R1233zd(E), however any other suitable working fluid can be used based on the system requirements and application.

The results show that the thermal insulation is improved when the thickness of the spacer 107 is increased because most of the heat is directed downwards by the first heat transfer means 109. Out of the example apparatus 101 the best thermal performance was obtained with the apparatus 101 comprising aerogel 301 and oscillating heat pipes 401. The improved thermal performance is provided because the aerogel 301 provides a lower thermal conductivity than air (0.025 compared to 0.0273 W/m/K at ambient pressure). Also the oscillating heat pipes 401 reduce the thermal resistance of the overall apparatus 101.

It is to be appreciated that variations of the apparatus 101 described above could be used in some examples of the disclosure. For instance, in some examples the photonic component 105 could be temperature controlled. This can allow for the heating of the photonic component 105 as well as the cooling. For instance, if the optimal temperature of the photonic component 105 is above the ambient temperature then the apparatus 101 can be configured to heat the photonic component 105 as appropriate.

The means for controlling the temperature of the photonic component 105 can comprise a thermo-electric cooler (TEC) a micro-TEC, an integrated heater or any other suitable means.

In the example apparatus 101 shown in this application the photonic component 105 is shown over the electronic circuitry component 103. It is to be appreciated that the apparatus 101 could work in any orientation and so, in some examples, the electronic circuitry component 103 could be provided over the photonic component 105.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
   at least one electronic circuitry component;
   at least one photonic component, wherein the at least one photonic component is positioned overlaying the at least one electronic circuitry component;
   at least one electrical connection between the at least one electronic circuitry component and the at least one photonic component, wherein the at least one electrical connection is less than 300 micrometers;

at least one spacer spacing the at least one electronic circuitry component and the at least one photonic component, wherein the at least one spacer is thermally insulating, and wherein the at least one spacer comprises aerogel;

at least one first heat transfer configured to remove heat from the at least one electronic circuitry component; and at least one second heat transfer configured to remove heat from the at least one photonic component.

2. The apparatus as claimed in claim 1 wherein the at least one first heat transfer is separate to the at least one second heat transfer.

3. The apparatus as claimed in claim 1 wherein at least one of the at least one first heat transfer or the at least one second heat transfer comprises a single-phase or a two-phase cooling system.

4. The apparatus as claimed in claim 3 wherein the two-phase cooling system comprises an oscillating heat pipe.

5. The apparatus as claimed in claim 1 comprising at least one temperature control for controlling temperature of the at least one photonic component.

6. The apparatus as claimed in claim 5 wherein the temperature control comprises a thermoelectric cooling component.

7. The apparatus as claimed in claim 1 comprising a signaller configured to provide signals between the at least one electronic circuitry component and the at least one photonic component.

8. The apparatus as claimed in claim 1 wherein the at least one electronic circuitry component is configured to control the at least one photonic component.

9. The apparatus as claimed in claim 1 wherein the at least one electronic circuitry component is configured to drive the at least one photonic component.

10. The apparatus as claimed in claim 1 wherein the at least one electronic circuitry component is configured to receive signals from the at least one photonic component.

11. The apparatus as claimed in claim 1 wherein the at least one spacer comprises one or more supports between the at least one electronic circuitry component and the at least one photonic component, wherein the supports provide an air gap between the at least one electronic circuitry component and the at least one photonic component.

12. The apparatus as claimed in claim 1 wherein the at least one electronic circuitry component comprises at least one of a chip or the at least one photonic component comprises a chip.

13. The apparatus as claimed in claim 1 wherein the at least one photonic component is positioned overlaying the at least one electronic circuitry component so that a surface of the at least one photonic component faces a surface of the at least one electronic circuitry component.

14. An electronic device comprising the apparatus as claimed in claim 1.

15. The electronic device as claimed in claim 14 where the electronic device comprises a smartphone, or a tablet, or a computer.

16. An apparatus comprising:
at least one electronic circuitry component;
at least one photonic component;
at least one electrical connection between the at least one electronic circuitry component and the at least one photonic component, wherein the at least one electrical connection is less than 300 micrometers;
at least one spacer located between an inner side of the at least one electronic circuitry component and an inner side of the at least one photonic component, wherein the at least one spacer is thermally insulating, wherein the at least one spacer comprises aerogel;
a first heat transfer member connected to the at least one electronic circuitry component at an outer side of the at least one electronic circuitry component, where the first heat transfer member is configured to remove heat from the at least one electronic circuitry component; and
a second heat transfer member connected to the at least one photonic component at an outer side of the at least one photonic component, where the second heat transfer member is configured to remove heat from the at least one photonic component, and where the second heat transfer member is spaced from the first heat transfer member.

* * * * *